(12) United States Patent
Zhang et al.

(10) Patent No.: US 11,296,182 B2
(45) Date of Patent: Apr. 5, 2022

(54) ORGANIC LIGHT-EMITTING DIODE DISPLAY SUBSTRATE, METHOD OF MANUFACTURING THE SAME, AND DISPLAY DEVICE

(71) Applicant: BOE TECHNOLOGY GROUP CO., LTD., Beijing (CN)

(72) Inventors: Hao Zhang, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 371 days.

(21) Appl. No.: 16/499,697

(22) PCT Filed: Mar. 25, 2019

(86) PCT No.: PCT/CN2019/079476
§ 371 (c)(1),
(2) Date: Sep. 30, 2019

(87) PCT Pub. No.: WO2019/223415
PCT Pub. Date: Nov. 28, 2019

(65) Prior Publication Data
US 2021/0408218 A1 Dec. 30, 2021

(30) Foreign Application Priority Data
May 24, 2018 (CN) .......................... 201810509909.8

(51) Int. Cl.
*H01L 27/32* (2006.01)
*H01L 51/56* (2006.01)

(52) U.S. Cl.
CPC .......... *H01L 27/3279* (2013.01); *H01L 51/56* (2013.01); *H01L 2227/323* (2013.01)

(58) Field of Classification Search
CPC .......................... H01L 27/3279; H01L 51/56
See application file for complete search history.

(56) References Cited

U.S. PATENT DOCUMENTS

| 2010/0213482 | A1  | 8/2010 | Kim et al. |
| 2017/0062548 | A1* | 3/2017 | Han .................. H01L 51/5228 |
| 2017/0077194 | A1* | 3/2017 | Liu ......................... H01L 27/32 |
| 2017/0125492 | A1  | 5/2017 | Kim et al. |
| 2017/0207423 | A1  | 7/2017 | Park et al. |

FOREIGN PATENT DOCUMENTS

| CN | 101814522 A | 8/2010 |
| CN | 106653797 A | 5/2017 |
| CN | 108766978 A | 11/2018 |

OTHER PUBLICATIONS

International Search Report and Written Opinion for Application No. PCT/CN2019/079476, dated Jul. 3, 2019, 10 Pages.

* cited by examiner

*Primary Examiner* — Douglas M Menz
(74) *Attorney, Agent, or Firm* — Brooks Kushman P.C.

(57) ABSTRACT

An OLED display substrate, a manufacturing method thereof, and a display device are provided. The OLED display substrate includes a base substrate, a conductive pattern, a driving circuit layer, an anode layer, a light-emitting layer and a cathode layer. The driving circuit layer, the anode layer, the cathode layer and the light-emitting layer are arranged at a same side of the base substrate. The conductive pattern is arranged between the base substrate and the driving circuit layer and electrically connected to the cathode layer through a plurality of via holes.

18 Claims, 2 Drawing Sheets

US 11,296,182 B2

ORGANIC LIGHT-EMITTING DIODE DISPLAY SUBSTRATE, METHOD OF MANUFACTURING THE SAME, AND DISPLAY DEVICE

CROSS-REFERENCE TO RELATED APPLICATIONS

This application is the U.S. national phase of PCT Application No. PCT/CN2019/079476 filed on Mar. 25, 2019, which claims priority to Chinese Patent Application No. 201810509909.8 filed on May 24, 2018, which are incorporated herein by reference in their entireties.

TECHNICAL FIELD

The present disclosure relates to the field of display technology, in particular to an organic light-emitting diode (OLED) display substrate, a manufacturing method thereof, and a display device.

BACKGROUND

For a conventional OLED display panel, a cathode layer is formed as an integral piece and connected to a signal input end via a VSS signal line at one side of a display region.

SUMMARY

In one aspect, the present disclosure provides in some embodiments an OLED display substrate, including a base substrate, a conductive pattern, a driving circuit layer, an anode layer, a light-emitting layer and a cathode layer. The driving circuit layer, the anode layer, the cathode layer and the light-emitting layer are arranged at a same side of the base substrate. The conductive pattern is arranged between the base substrate and the driving circuit layer and electrically connected to the cathode layer through a plurality of via holes.

In a possible embodiment of the present disclosure, the conductive pattern is made of metal.

In a possible embodiment of the present disclosure, the conductive pattern includes a first part and a second part, and the first part is electrically connected to the cathode layer through the plurality of via holes.

In a possible embodiment of the present disclosure, the second part includes a plurality of hollowed-out regions.

In a possible embodiment of the present disclosure, the first part is insulated from the second part.

In a possible embodiment of the present disclosure, the driving circuit layer includes a plurality of driving thin film transistors (TFTs), the conductive pattern includes a plurality of hollowed-out regions corresponding to the driving TFTs in a one-to-one manner, and an orthogonal projection of each driving TFT onto the base substrate falls within an orthogonal projection of a corresponding hollowed-out region onto the base substrate.

In a possible embodiment of the present disclosure, the driving circuit layer includes a plurality of a signal lines, and an orthogonal projection of the conductive pattern onto the base station falls within orthogonal projections of the plurality of signal lines onto the base substrate.

In a possible embodiment of the present disclosure, the OLED display substrate includes a display region and a non-display region surrounding the display region, and the plurality of via holes is arranged at the non-display region.

In a possible embodiment of the present disclosure, the OLED display substrate further includes an insulation layer arranged between the conductive pattern and the driving circuit layer.

In another aspect, the present disclosure provides in some embodiments a method for manufacturing an OLED display substrate, including: providing a base substrate; forming a conductive pattern at one side of the base substrate; forming a driving circuit layer, an anode layer and a light-emitting layer sequentially at a side of the conductive pattern away from the base substrate; forming a plurality of via holes for exposing the conductive pattern; and forming a cathode layer at a side of the light-emitting layer away from the base substrate. The cathode layer is electrically connected to the conductive pattern through the plurality of via holes.

In a possible embodiment of the present disclosure, the forming a conductive pattern at one side of the base substrate comprises forming the conductive pattern comprising a first part and a second part at one side of the base substrate, and the forming the plurality of via holes for exposing the conductive pattern comprises forming the plurality of via holes for exposing the first part.

In a possible embodiment of the present disclosure, subsequent to forming the conductive pattern including the first part and the second part, the method further includes oxidizing a portion of the conductive pattern at a boundary between the first part and the second part, so as to enable the first part to be insulated from the second part. The conductive pattern is made of metal.

In a possible embodiment of the present disclosure, the forming the conductive pattern including the first part and the second part at one side of the base substrate includes forming a plurality of hollowed-out regions in the second part.

In a possible embodiment of the present disclosure, the forming the conductive pattern at one side of the base substrate includes forming a plurality of hollowed-out regions corresponding to driving TFTs in a one-to-one manner in the conductive pattern. The driving circuit layer includes the plurality of driving TFTs, and an orthogonal projection of each driving TFT onto the base substrate falls within an orthogonal projection of a corresponding hollowed-out region onto the base substrate.

In a possible embodiment of the present disclosure, the driving circuit layer includes a plurality of signal lines, and an orthogonal projection of the conductive pattern onto the base substrate falls within orthogonal projections of the plurality of signal lines onto the base substrate.

In a possible embodiment of the present disclosure, the method further includes forming an insulation layer between the conductive pattern and the driving circuit layer.

In yet another aspect, the present disclosure provides in some embodiments a display device including the above-mentioned OLED display substrate.

DETAILED DESCRIPTION

Figure 1:
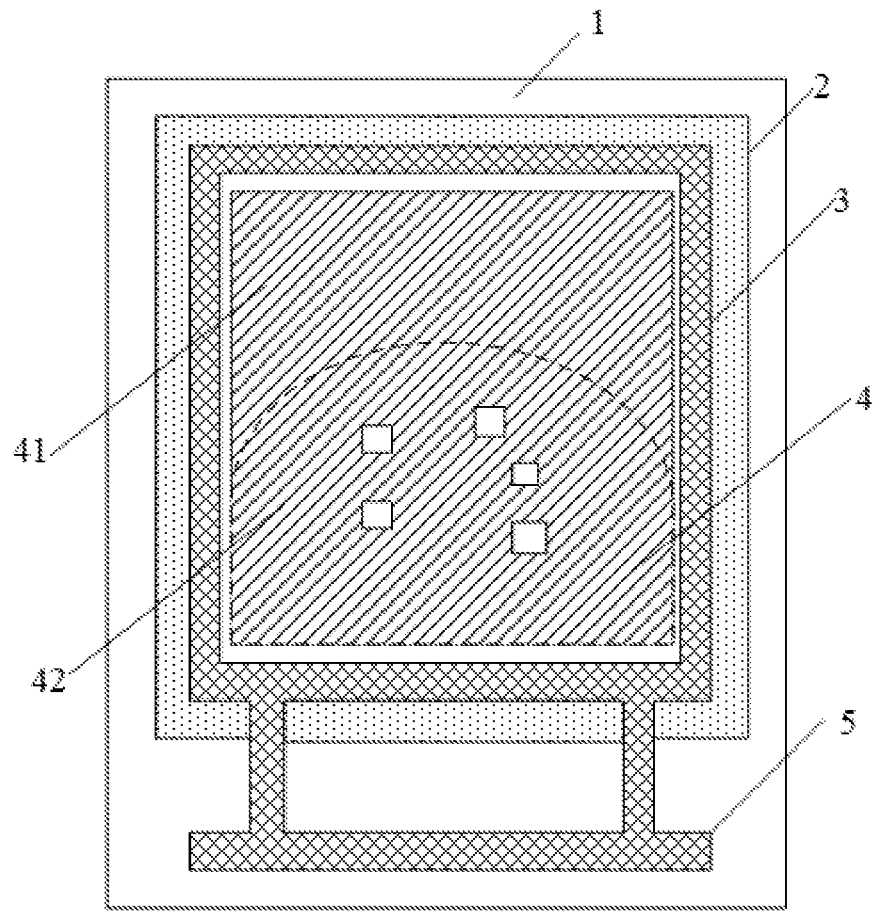
FIG. 1 is a schematic view showing an OLED display substrate according to one embodiment of the present disclosure.

In order to make the objects, the technical solutions and the advantages of the present disclosure more apparent, the present disclosure will be described hereinafter in a clear and complete manner in conjunction with the drawings and embodiments.

In the related art, a cathode layer is formed as a whole layer, and when the cathode layer is connected to a signal input end through a VSS signal line at one side of a display region, an IR drop may occur for the cathode layer (i.e., a cathode) in a direction away from the signal input end due to a resistance of the cathode, resulting in non-uniform brightness for an OLED display panel.

An object of the present disclosure is to provide an OLED display substrate, a manufacturing method thereof, and a display device, so as to reduce an equivalent resistance of the cathode layer, thereby to prevent the occurrence of non-uniform brightness for the display panel due to the IR drop of the cathode.

The present disclosure provides in some embodiments an OLED display substrate which includes a driving circuit layer, an anode layer, a cathode layer and a light-emitting layer arranged on a base substrate. The OLED display substrate may further include a conductive pattern arranged between the base substrate and the driving circuit layer. The conductive pattern may be electrically connected to the cathode layer through a plurality of via holes.

According to the OLED display substrate in the embodiments of the present disclosure, the conductive pattern is connected in parallel to the cathode layer, and an equivalent resistance of the cathode layer=(a resistance of the conductive pattern*a resistance of the cathode layer)/(the resistance of the conductive pattern+the resistance of the cathode layer), i.e., the equivalent resistance of the cathode layer may be reduced. At this time, an IR drop of the cathode layer may be approximately equal to 0V in a direction away from a signal input end. As a result, it is able to prevent the occurrence of non-uniform brightness due to the IR drop of the cathode layer.

In addition, when the equivalent resistance of the cathode layer is reduced due to the conductive pattern, a width of a peripheral VSS signal line may be reduced too, so it is able to provide a display device with a narrow bezel.

In some embodiments of the present disclosure, the OLED display substrate may further include an insulation layer arranged between the conductive pattern and the driving circuit layer.

The conductive pattern may be arranged between the driving circuit layer and the base substrate, and the insulation layer may be arranged between the conductive pattern and the driving circuit layer, so as to enable the conductive pattern to be insulated from the driving circuit layer.

In some embodiments of the present disclosure, the conductive pattern may be made of metal.

In some embodiments of the present disclosure, the conductive pattern may be made of any other conductive material, e.g., a transparent conductive material.

As compared with the transparent conductive material, metal has better conductivity, i.e., a resistance of the metal is smaller than that of the transparent conductive material. The equivalent resistance of the cathode layer which has been connected in parallel to the conductive pattern made of metal may be smaller than that of the cathode layer which has been connected in parallel to the conductive pattern made of the transparent conductive material. Hence, the IR drop of the cathode layer which has been connected in parallel to the conductive pattern made of metal may be smaller than the IR drop of the cathode layer which has been connected in parallel to the conductive pattern made of the transparent conductive material.

In some embodiments of the present disclosure, the conductive pattern may include a first part and a second part, and the first part may be electrically connected to the cathode layer through the plurality of via holes.

In some embodiments of the present disclosure, the first part may be located away from the signal input end.

When the cathode layer is connected to the signal input end via the VSS signal line, the IR drop between the signal input end and the cathode layer away from the signal input end may be greater than the IR drop between the signal input end and the cathode layer adjacent to the signal input end. Hence, the first part which is electrically connected to the cathode layer through the plurality of via holes may be arranged at a position away from the signal input end, so as to reduce the equivalent resistance of a portion of the cathode layer away from the signal input end (i.e., a remote part of cathode layer) after the remote cathode layer part has been connected in parallel to the conductive pattern, thereby to reduce the IR drop of the remote part of cathode layer.

In some embodiments of the present disclosure, the second part may include a plurality of first hollowed-out regions.

When the second part of the conductive pattern is provided with the plurality of first hollowed-out regions and the OLED display substrate is touched by a user, light reflected by valleys or ridges of a user's fingerprint may pass through the first hollowed-out region toward a fingerprint identification module at a back surface of the OLED display substrate, so as to achieve a fingerprint identification function.

In some embodiments of the present disclosure, the first part may be insulated from the second part.

Because the first part is connected in parallel to the cathode layer, the first part may receive the VSS signal. In order to prevent the driving circuit layer from being adversely affected by the VSS signal on the conductive pattern, the first part may be insulated from the second part, and the second part may not receive any electric signal. At this time, the driving circuit layer may be not adversely affected by the second part.

In some embodiments of the present disclosure, the driving circuit layer may include a plurality of driving TFTs, and the conductive pattern may include a plurality of second hollowed-out regions corresponding to the driving TFTs in a one-to-one manner. An orthogonal projection of each driving TFT onto the base substrate may fall within an orthogonal projection of a corresponding second hollowed-out region onto the base substrate.

Through the plurality of second hollowed-out regions, it is able to prevent the driving TFT from being adversely affected by the VSS signal when the VSS signal is applied to the conductive pattern.

In some embodiments of the present disclosure, the driving circuit layer may include a plurality of signal lines, and an orthogonal projection of the conductive pattern onto the base substrate may fall within orthogonal projections of the signal lines onto the base substrate.

In order to prevent the driving TFT from being adversely affected by the VSS signal when the VSS signal is applied to the conductive pattern, the orthogonal projection of the conductive pattern onto the base substrate may fall within the orthogonal projections of the signal lines in the other layers of the OLED display substrate onto the base substrate. For example, the orthogonal projection of the conductive pattern onto the base substrate may coincide with the orthogonal projections of the signal lines in the other layers of the OLED display substrate onto the base substrate.

In some embodiments of the present disclosure, the OLED display substrate may include a display region and a non-display region surrounding the display region, and the plurality of via holes through which the conductive pattern is connected to the cathode layer may be arranged beyond the display region (i.e., at the non-display region).

When the via holes are arranged beyond the display region, it is able to prevent a display function of the display substrate from being adversely affected by the via holes.

As shown in FIG. 1, the OLED display substrate 1 may include a cathode layer 2, a VSS signal line 3, a conductive pattern 4 and a signal input end 5. The conductive pattern 4 may include a first part 41 and a second part 42. The first part 41 may be arranged away from the signal input end 5, and the second part 42 may be arranged adjacent to the signal input end 5.

When the first part 41 and the second part 42 of the conductive pattern 4 are connected to the signal input end 5 via the VSS signal line 3, the IR drop of a portion of the cathode layer connected in parallel to the second part 42 may be smaller than the IR drop of a portion of the cathode layer connected in parallel to the first part 41, because the signal input end 5 connected to the VSS signal line 3 is located adjacent to the second part 42. In some embodiments of the present disclosure, the second part 42 may not be connected to the cathode layer 2.

Usually, the fingerprint identification module is also arranged at a side of the OLED display substrate. When the second part 42 is provided with a plurality of first hollowed-out regions and the OLED display substrate is touched by a user, light reflected by valleys or ridges of a user's fingerprint may pass through the first hollowed-out region toward the fingerprint identification module at a back surface of the OLED display substrate, so as to achieve a fingerprint identification function.

The IR drop of a portion of the cathode layer connected in parallel to the first part 41 is greater than the IR drop of a portion of the cathode layer connected in parallel to the second part 42. Hence, when the first part 41 is connected in parallel to the cathode layer through the plurality of via holes, the equivalent resistance of the cathode layer 2 connected in parallel to the first part 41 may be reduced, and the IR drop of the cathode layer may be substantially 0V in a direction away from the signal input end. As a result, it is able to prevent the occurrence of non-uniform brightness due to the IR drop of the cathode.

The present disclosure further provides in some embodiments a method of manufacturing an OLED display substrate, including forming a driving circuit layer, an anode layer, a light-emitting layer and a cathode layer sequentially on a base substrate.

Prior to forming the driving circuit layer, the method may further include forming a conductive pattern.

Prior to forming the cathode layer, the method may further include forming a plurality of via holes for exposing the conductive pattern so that the cathode layer may be electrically connected to the conductive pattern through the plurality of via holes.

Figure 2:
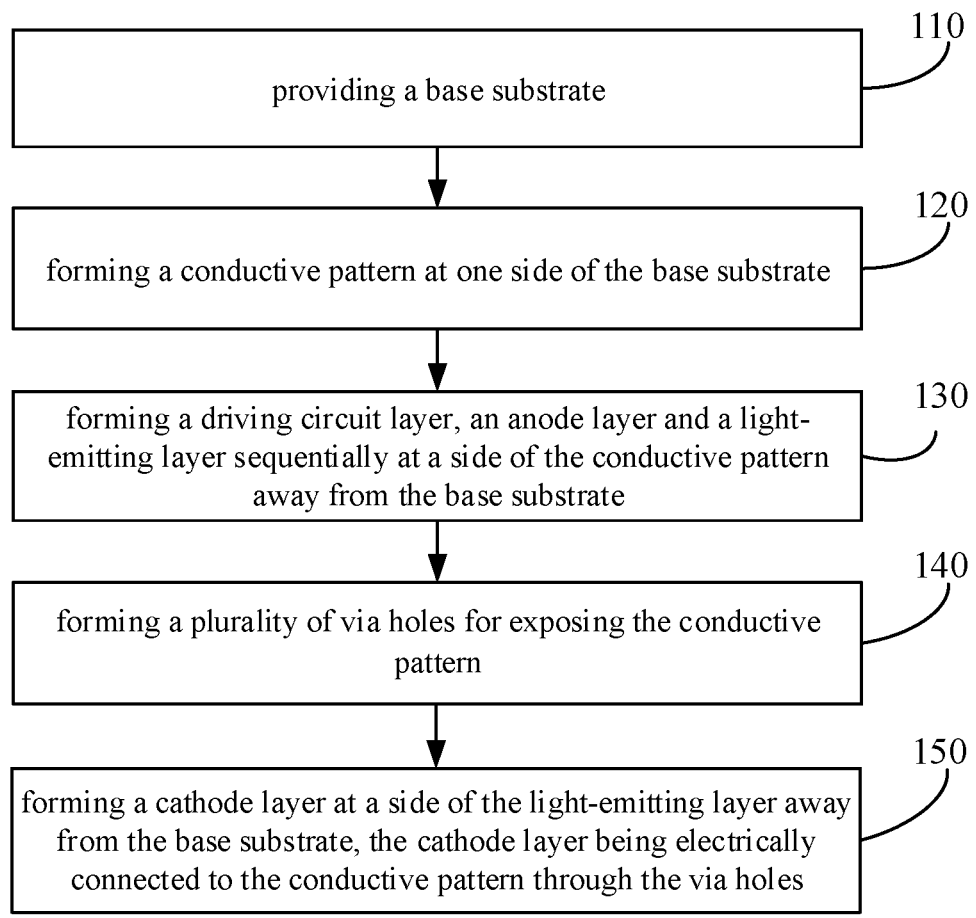
FIG. 2 is a flow chart of a method of manufacturing the OLED display substrate according to one embodiment of the present disclosure.

In other words, as shown in FIG. 2 the method may include: Step 110 of providing the base substrate; Step 120 of forming the conductive pattern at one side of the base substrate; Step 130 of forming the driving circuit layer, the anode layer and the light-emitting layer at a side of the conductive pattern away from the base substrate; Step 140 of forming the plurality of via holes for exposing the conductive pattern; and Step 150 of forming the cathode layer at a side of the light-emitting layer away from the base substrate, where the cathode layer is electrically connected to the conductive pattern through the plurality of via holes.

According to the method in the embodiments of the present disclosure, the OLED display substrate may include the conductive pattern connected in parallel to the cathode layer, so as to reduce the equivalent resistance of the cathode layer. At this time, the IR drop of the cathode layer may be approximately equal to 0V in the direction away from the signal input end. As a result, it is able to prevent the occurrence of non-uniform brightness due to the IR drop of the cathode layer.

In addition, when the equivalent resistance of the cathode layer is reduced due to the conductive pattern, a width of a peripheral VSS signal line may be reduced too, so it is able to provide a display device with a narrow bezel.

In some embodiments of the present disclosure, the OLED display substrate may further include an insulation layer. The conductive pattern may be arranged between the driving circuit layer and the base substrate, and the insulation layer may be arranged between the conductive pattern and the driving circuit layer, so as to enable the conductive pattern to be insulated from the driving circuit layer.

In some embodiments of the present disclosure, the conductive pattern may be made of metal.

In some embodiments of the present disclosure, the conductive pattern may be made of any other conductive material, e.g., a transparent conductive material.

As compared with the transparent conductive material, metal has better conductivity, i.e., a resistance of the metal is smaller than that of the transparent conductive material. The equivalent resistance of the cathode layer which has been connected in parallel to the conductive pattern made of metal may be smaller than that of the cathode layer which has been connected in parallel to the conductive pattern made of the transparent conductive material. Hence, the IR drop of the cathode layer which has been connected in parallel to the conductive pattern made of metal may be smaller than the IR drop of the cathode layer which has been connected in parallel to the conductive pattern made of the transparent conductive material.

In some embodiments of the present disclosure, the forming the conductive pattern at one side of the base substrate may include forming the conductive pattern including a first part and a second part at one side of the base substrate. The second part may include a plurality of first hollowed-out regions.

In some embodiments of the present disclosure, the forming the plurality of via holes for exposing the conductive pattern may include forming the plurality of via holes for exposing the first part.

In some embodiments of the present disclosure, the first part may be located away from the signal input end.

When the cathode layer is connected to the signal input end via the VSS signal line, the IR drop between the signal input end and the cathode layer away from the signal input end may be greater than the IR drop between the signal input end and the cathode layer adjacent to the signal input end. Hence, the first part which is electrically connected to the cathode layer through the plurality of via holes may be arranged at a position away from the signal input end, so as to reduce the equivalent resistance of a portion of the cathode layer away from the signal input end (i.e., a remote part of cathode layer) after the remote part of cathode layer has been connected in parallel to the conductive pattern, thereby to reduce the IR drop of the remote part of cathode layer.

When the second part of the conductive pattern is provided with the plurality of first hollowed-out regions and the OLED display substrate is touched by a user, light reflected by valleys or ridges of a user's fingerprint may pass through the first hollowed-out region toward a fingerprint identification module at a back surface of the OLED display substrate, so as to achieve a fingerprint identification function.

In some embodiments of the present disclosure, subsequent to forming the conductive pattern including the first part and the second part, the method may further include oxidizing a portion of the conductive pattern at a boundary between the first part and the second part, so as to enable the first part to be insulated from the second part. The conductive pattern may be made of metal.

Because the first part is connected in parallel to the cathode layer, the first part may receive the VSS signal. In order to prevent the driving circuit layer from being adversely affected by the VSS signal on the conductive pattern, the first part may be insulated from the second part, and the second part may not receive any electric signal. At this time, the driving circuit layer may be not adversely affected by the second part. When the conductive pattern is made of metal, the portion of the conductive pattern at the boundary between the first part and the second part may be oxidized, so as to enable the first part to be insulated from the second part.

In some embodiments of the present disclosure, the forming the conductive pattern at one side of the base substrate may include forming a plurality of second hollowed-out regions corresponding to driving TFTs in a one-to-one manner in the conductive pattern. The driving circuit layer may include the plurality of driving TFTs, and an orthogonal projection of each driving TFT onto the base substrate may fall within an orthogonal projection of a corresponding second hollowed-out region onto the base substrate.

In some embodiments of the present disclosure, the method may further include forming an insulation layer between the conductive pattern and the driving circuit layer.

The present disclosure further provides in some embodiments a display device including the above-mentioned OLED display substrate.

In some embodiments of the present disclosure, the display device may be any product or part having a display function, e.g., television, display, digital photo frame, mobile phone or flat-panel computer.

In some embodiments of the present disclosure, the display device may further include a flexible circuit board, a printed circuit board and a back plate.

In some embodiments of the present disclosure, the display device may include the OLED display substrate in FIG. 1.

According to the display device in the embodiments of the present disclosure, the OLED display substrate may include the conductive pattern connected in parallel to the cathode layer, so as to reduce the equivalent resistance of the cathode layer. At this time, the IR drop of the cathode layer may be approximately equal to 0V in the direction away from the signal input end. As a result, it is able to prevent the occurrence of non-uniform brightness due to the IR drop of the cathode layer. In addition, when the equivalent resistance of the cathode layer is reduced due to the conductive pattern, a width of a peripheral VSS signal line may be reduced too, so it is able to provide the display device with a narrow bezel.

Unless otherwise defined, any technical or scientific term used herein shall have the common meaning understood by a person skilled in the art. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "comprise" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An organic light-emitting diode (OLED) display substrate, comprising a base substrate, a conductive pattern, a driving circuit layer, an anode layer, a light-emitting layer and a cathode layer, wherein the driving circuit layer, the anode layer, the cathode layer and the light-emitting layer are arranged at a same side of the base substrate, and the conductive pattern is arranged between the base substrate and the driving circuit layer and electrically connected to the cathode layer through a plurality of via holes.

2. The OLED display substrate according to claim 1, wherein the conductive pattern is made of metal.

3. The OLED display substrate according to claim 2, wherein the conductive pattern comprises a first part and a second part, and the first part is electrically connected to the cathode layer through the plurality of via holes.

4. The OLED display substrate according to claim 3, wherein the second part comprises a plurality of hollowed-out regions.

5. The OLED display substrate according to claim 3, wherein the first part is insulated from the second part.

6. The OLED display substrate according to claim 1, wherein the driving circuit layer comprises a plurality of driving thin film transistors (TFTs), the conductive pattern comprises a plurality of hollowed-out regions corresponding to the driving TFTs in a one-to-one manner, and an orthogonal projection of each driving TFT onto the base substrate falls within an orthogonal projection of a corresponding hollowed-out region onto the base substrate.

7. The OLED display substrate according to claim 1, wherein the driving circuit layer comprises a plurality of a signal lines, and an orthogonal projection of the conductive pattern onto the base station falls within orthogonal projections of the plurality of signal lines onto the base substrate.

8. The OLED display substrate according to claim 1, wherein the OLED display substrate comprises a display region and a non-display region surrounding the display region, and the plurality of via holes is arranged at the non-display region.

9. The OLED display substrate according to claim 1, further comprising an insulation layer arranged between the conductive pattern and the driving circuit layer.

10. A display device comprising the OLED display substrate according to claim 1.

11. The OLED display substrate according to claim 4, wherein the first part is insulated from the second part.

12. A method of manufacturing an organic light-emitting diode (OLED) display substrate, comprising:
    providing a base substrate;
    forming a conductive pattern at one side of the base substrate;
    forming a driving circuit layer, an anode layer and a light-emitting layer sequentially at a side of the conductive pattern away from the base substrate;
    forming a plurality of via holes for exposing the conductive pattern; and
    forming a cathode layer at a side of the light-emitting layer away from the base substrate, wherein the cathode layer is electrically connected to the conductive pattern through the plurality of via holes.

13. The method according to claim 12, wherein the forming a conductive pattern at one side of the base substrate comprises forming the conductive pattern comprising a first part and a second part at one side of the base substrate, and
    the forming the plurality of via holes for exposing the conductive pattern comprises forming the plurality of via holes for exposing the first part.

14. The method according to claim 13, wherein subsequent to forming the conductive pattern comprising the first part and the second part, the method further comprises oxidizing a portion of the conductive pattern at a boundary between the first part and the second part, to enable the first part to be insulated from the second part, wherein the conductive pattern is made of metal.

15. The method according to claim 13, wherein the forming the conductive pattern comprising the first part and the second part at one side of the base substrate comprises forming a plurality of hollowed-out regions in the second part.

16. The method according to claim 12, wherein the forming the conductive pattern at one side of the base substrate comprises forming a plurality of hollowed-out regions corresponding to driving TFTs in a one-to-one manner in the conductive pattern, wherein the driving circuit layer comprises the plurality of driving thin film transistors (TFTs), and an orthogonal projection of each driving TFT onto the base substrate falls within an orthogonal projection of a corresponding hollowed-out region onto the base substrate.

17. The method according to claim 12, wherein the driving circuit layer comprises a plurality of signal lines, and an orthogonal projection of the conductive pattern onto the base substrate falls within orthogonal projections of the plurality of signal lines onto the base substrate.

18. The method according to claim 12, further comprising forming an insulation layer between the conductive pattern and the driving circuit layer.

* * * * *